United States Patent
Blanks

(10) Patent No.: US 10,897,264 B2
(45) Date of Patent: Jan. 19, 2021

(54) DATA RECEIVER FOR COMMUNICATION SYSTEM

(71) Applicant: BOOZ ALLEN HAMILTON INC., McLean, VA (US)

(72) Inventor: Keith A. Blanks, Colorado Springs, CO (US)

(73) Assignee: BOOZ ALLEN HAMILTON INC., McLean, VA (US)

(*) Notice: Subject to any disclaimer, the term of this patent is extended or adjusted under 35 U.S.C. 154(b) by 0 days.

(21) Appl. No.: 16/450,179

(22) Filed: Jun. 24, 2019

(65) Prior Publication Data

US 2020/0403631 A1    Dec. 24, 2020

(51) Int. Cl.
*H03M 1/12* (2006.01)
*H03M 1/46* (2006.01)
*H03M 1/78* (2006.01)

(52) U.S. Cl.
CPC ........... *H03M 1/462* (2013.01); *H03M 1/785* (2013.01)

(58) Field of Classification Search
CPC ...... H03M 1/002; H03M 1/12; H03M 1/0845; H03M 1/183; H03M 7/10; H03M 1/0836;
(Continued)

(56) References Cited

U.S. PATENT DOCUMENTS 4,498,072 A * 2/1985 Moriyama ............. H03M 1/40
341/118
4,616,210 A * 10/1986 Ferber ................. H03M 1/0607
341/122

(Continued)

FOREIGN PATENT DOCUMENTS

EP    2670103 A1    12/2013
WO    2009085254 A1    7/2009

OTHER PUBLICATIONS

Berman, G., et al., "High Data-rate, Free-space Laser Communication Based on Frequency Encoding of a Partially Coherent Beam," Los Alamos National Laboratory, (2009), pp. 98-99.

(Continued)

*Primary Examiner* — Linh V Nguyen
(74) *Attorney, Agent, or Firm* — Bunchanan Ingersoll & Rooney PC

(57) ABSTRACT

An analog signal processing module includes a processor and a comparator circuit module having a comparator circuit input and a comparator circuit output, the comparator circuit module being configured to receive a first analog signal at the comparator circuit input and generate a digital output, wherein the comparator circuit output is connected to the processor. A digital-to-analog converter (DAC) module is configured to receive a digital output from the processor and convert the digital output to a second analog signal. An operational amplifier (OpAmp) circuit module has an OpAmp circuit input and an OpAmp circuit output, the OpAmp circuit module being configured to receive the second analog signal at the OpAMp circuit input. A feedback loop is formed by the processor, the DAC module, and the OpAMp circuit module, and is configured to implement an amplification function or attenuation function performed by the OpAmp circuit module.

16 Claims, 5 Drawing Sheets

(58) Field of Classification Search
CPC ...... H03M 1/468; H03M 1/765; H03M 1/167;
H03M 1/0673; H03M 1/46; H03M
1/0604; H03M 1/168; G02B 27/286;
G02B 27/4244; G02B 26/0833; G02B
26/0816; G02B 27/30; G02B 27/095;
G02B 27/283; G02B 6/102; G02B 6/105;
G02B 6/2817; G02B 6/2931; G02B
6/322; G02B 6/3534
USPC ............ 341/118, 120, 143, 155, 164, 165
See application file for complete search history.

(56) References Cited

U.S. PATENT DOCUMENTS

| | | | |
|---|---|---|---|
| 5,001,480 A * | 3/1991 | Ferry | G06J 1/00 341/108 |
| 5,070,332 A * | 12/1991 | Kaller | H03M 1/0619 341/156 |
| 5,943,132 A * | 8/1999 | Erskine | G01S 7/352 356/484 |
| 6,920,290 B2 | 7/2005 | Mitra | |
| 7,127,168 B2 | 10/2006 | Kani et al. | |
| 8,031,391 B2 | 10/2011 | Bartlett et al. | |
| 8,144,321 B2 | 3/2012 | Duncan et al. | |
| 8,879,922 B2 | 11/2014 | Liu et al. | |
| 10,050,715 B1 | 8/2018 | Blanks et al. | |
| 2002/0075539 A1 | 6/2002 | Iida et al. | |
| 2003/0134607 A1 | 7/2003 | Raghavan et al. | |
| 2004/0042798 A1 | 3/2004 | Kehr et al. | |
| 2005/0286047 A1* | 12/2005 | Boege | G01J 3/4406 356/317 |
| 2010/0310256 A1 | 12/2010 | Shpantzer et al. | |
| 2012/0044565 A1 | 2/2012 | Wang et al. | |
| 2012/0139764 A1* | 6/2012 | Sosio | H03M 3/368 341/110 |
| 2012/0241427 A1* | 9/2012 | Maltsev | B23K 26/082 219/121.85 |
| 2013/0182620 A1 | 7/2013 | Chaffee et al. | |
| 2015/0029503 A1* | 1/2015 | McMackin | G01J 3/2823 356/300 |
| 2015/0171957 A1 | 6/2015 | Featherston et al. | |
| 2015/0244389 A1* | 8/2015 | Lim | H03M 1/0863 341/164 |
| 2015/0358087 A1 | 12/2015 | Pavlas et al. | |
| 2016/0094236 A1* | 3/2016 | Shionoiri | H03M 1/002 341/122 |
| 2016/0301403 A1* | 10/2016 | Cassagnes | H03F 3/45475 |
| 2018/0183455 A1* | 6/2018 | Lee | H03M 1/462 |
| 2018/0191445 A1 | 7/2018 | Blanks | |
| 2018/0191446 A1 | 7/2018 | Blanks | |

OTHER PUBLICATIONS

Yamanaka, C., et al., "Development of a terawatt coherent white light lidar system and applications to environmental studies," Multispectral, Hyperspectral, and Ultraspectral Remote Sensing Technology, Techniques, and Applications II, Proc. of SPIE vol. 7149, 71490Z, pp. 1-8.

Berman, G., et al., "Suppression of intensity fluctuations in free space high-speed optical communication based on spectral encoding of a partially coherent beam," Science Direct, Optics Communications, vol. 280, (Aug. 2007), pp. 264-270.

International Search Report and Written Opinion issued in International Patent Application No. PCT/ US2017/043937, 8 pages (dated Nov. 8, 2017).

D.O. Caplan et al., "WDM Laser Transmitters for Mobile Free-space Laser Communications", Proceedings of SPIE, Apr. 13, 2016, vol. 9739, pp. 97390W1-97390W11, XP060065604.

M. Stern et al., "Self-Phase Modulation and Dispersion in High Data Rate Fiber-Optic Transmission Systems", Journal of Lightwave Technology, IEEE, USA, Jul. 1, 1990, vol. 8, No. 7, pp. 1009-1016, XP000171589.

The extended European Search Report dated Jun. 26, 2020, by the European Patent Office in corresponding European Application No. 17889184.2. (10 pages).

* cited by examiner

DATA RECEIVER FOR COMMUNICATION SYSTEM

FIELD

Embodiments relate to systems and methods for optical communication.

BACKGROUND INFORMATION

Existing optical communications systems utilize data receivers that rely on analog-to-digital converter devices. Such data receivers fail to provide effective and efficient gain control of the optical communication signal and/or filtration of undesired radiation having spectral content that overlaps with spectral content of the light of the optical communication signal. This problem is exacerbated for communication signals that are encoded via certain modulation formats (e.g., frequency presence modulation).

SUMMARY

Embodiments can relate to an analog signal processing module that includes a processor and a comparator circuit module having a comparator circuit input and a comparator circuit output, the comparator circuit module being configured to receive a first analog signal at the comparator circuit input and generate a digital output, wherein the comparator circuit output is connected to the processor. The analog signal processing module includes a digital-to-analog converter (DAC) module configured to receive a digital output from the processor and convert the digital output to a second analog signal. The analog signal processing module includes an operational amplifier (OpAmp) circuit module having an OpAmp circuit input and an OpAmp circuit output, the OpAmp circuit module being configured to receive the second analog signal at the OpAmp circuit input. The analog signal processing module includes a feedback loop formed by the processor, the DAC module, and the OpAmp circuit module configured to implement an amplification function or attenuation function performed by the OpAmp circuit module.

Embodiments can relate to a data receiver for a communication system, the data receiver including a receiving telescope configured to receive an optical communications signal and generate a beam output. The data receiver includes a receiver module (RM) configured to receive the beam output from the receiving telescope, wherein the RM includes: a RM grating configured to disperse spectral content of the beam output; a RM first mirror configured to receive the dispersed spectral content of the beam output and collimate the dispersed spectral content of the beam output, and a RM second mirror configured to receive the collimated spectral content of the beam output and direct the collimated spectral content of the beam output onto a photodiode array (PDA) to generate a first analog signal. The data receiver includes an analog signal processing module that includes a processor; a comparator circuit module having a comparator circuit input and a comparator circuit output, the comparator circuit module configured to receive the first analog signal at the comparator circuit input and generate a digital output, wherein the comparator circuit output is connected to the processor; a DAC module configured to receive the digital output from the processor and convert the digital output to a second analog signal; an OpAmp circuit module having an OpAmp circuit input and an OpAmp circuit output, the OpAmp circuit module configured to receive the second analog signal at the OpAmp circuit input; and a feedback loop formed by the processor, the DAC module, and the OpAmp circuit module configured to implement an amplification function or attenuation function performed by the OpAmp circuit module on the second analog signal to generate an amplitude controlled second analog signal.

Embodiments can relate to a method for optical communication, the method involving: receiving a first analog signal at a comparator circuit module and generating a digital output; selecting a digital sample from the digital output via a processor; receiving the sampled digital output at a DAC module and generating a second analog signal; and receiving the second analog signal at an OpAmp circuit module, wherein the processor, the DAC module, and the OpAmp circuit module form a feedback loop so that an amplification function or attenuation function will be performed by the OpAmp circuit module on the second analog signal to generate an amplitude controlled second analog signal.

BRIEF DESCRIPTION OF THE DRAWINGS

Other features and advantages of the present disclosure will become more apparent upon reading the following detailed description in conjunction with the accompanying drawings, wherein like elements are designated by like numerals, and wherein.

DETAILED DESCRIPTION

Figure 1:
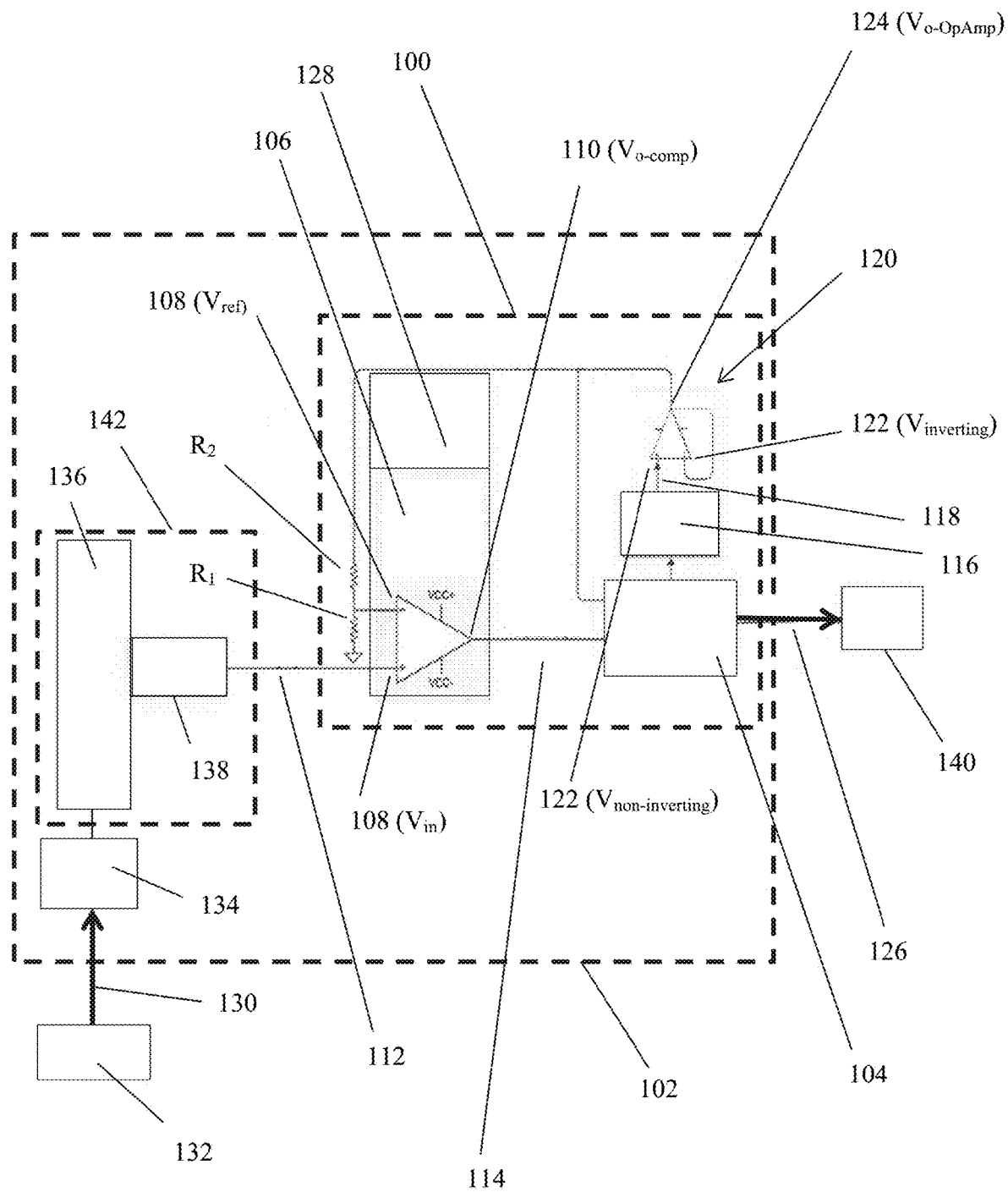
FIG. 1 shows an embodiment of the analog signal processing module architecture in combination with an exemplary data receiver.

Referring to FIG. 1, embodiments can relate to an analog signal processing module 100, which may be used as a component of a data receiver 102. It is contemplated for the data receiver 102 to be used as a component of a communication system 300 (e.g., optical communication system) in which signals of the optical communication system 300 are encoded with information via a modulation technique. For example, an embodiment of the data receiver 102 using an embodiment of the analog signal processing module 100 can be used to receive and/or process modulated signals (e.g., amplitude modulated signals, frequency modulated signals, phase modulated signals, pulse position modulated signals, On-Off key modulated signals, frequency presence modulated signals, etc.).

Embodiments of the analog signal processing module 100 can include a processor 104. The processor 104 can be configured to select or sample an analog or digital signal for further processing. In an exemplary embodiment, the processor 104 is configured to sample or select a digitized signal that is representative of an analog optical signal used in the communication system 300.

References to modules and processors in this disclosure can include components embodied as circuitry, integrated circuitry, a processor, a controller, a computer, hardware, software, firmware, etc., or any combination thereof. Embodiments of a processor can include a processing unit operatively associated with a memory. The processing unit can include a scalable processor, a parallelizable processor, etc., and may be optimized for multi-thread processing capabilities. Embodiments of the processor can be a computer (e.g., supercomputer, a quantum computer, etc.) whose processing power is selected as a function of anticipated network traffic (e.g. data flow). The processor can include any integrated circuit or other electronic device, or a collection thereof, capable of performing an operation on at least one instruction. This can include Reduced Instruction Set Core (RISC) processors, CISC microprocessors, Microcontroller Units (MCUs), CISC-based Central Processing Units (CPUs), Digital Signal Processors (DSPs), etc. The hardware of such devices may be integrated onto a single substrate (e.g., silicon "die"), or distributed among two or more substrates. Various functional aspects of a processor may be implemented solely as software or firmware associated with the processor.

The memory can be optionally associated with a processor. Embodiments of the memory can include a volatile memory store (such as RAM), non-volatile memory store (such as ROM, flash memory, etc.), or some combination of the two. For instance, the memory can include, but is not limited to, RAM, ROM, EEPROM, flash memory, or other memory technology, or CDROM, digital versatile disks (DVD) or other optical storage, magnetic cassettes, magnetic tape, magnetic disk storage or other magnetic storage devices, or any other medium that can be used to store the desired information and that can accessed by the processor. It is contemplated for the memory to be a non-transitory computer-readable medium. The term "computer-readable medium" (or "machine-readable medium") as used herein is an extensible term that refers to any medium or any memory, that participates in providing instructions to a processor for execution, or any mechanism for storing or transmitting information in a form readable by a machine (e.g., a computer). Such a medium may store computer-executable instructions to be executed by a processing element and/or control logic, and data that is manipulated by a processing element and/or control logic, and may take many forms, including but not limited to, non-volatile medium, volatile medium, and transmission media.

Transmission media can include coaxial cables, copper wire, fiber optics, etc., including the wires that include or form a bus. Transmission media can also take the form of acoustic or light waves, such as those generated during radio-wave and infrared data communications, or other form of propagated signals (e.g., carrier waves, infrared signals, digital signals, etc.). Forms of computer-readable media include, for example, a floppy disk, a flexible disk, hard disk, magnetic tape, or any other magnetic medium, a CD-ROM, any other optical medium, punch-cards, paper-tape, any other physical medium with patterns of holes, a RAM, a PROM, and EPROM, a FLASH-EPROM, any other memory chip or cartridge, or any other medium from which a computer can read.

Instructions for implementation of any of the methods disclosed herein can be stored on a memory in the form of computer program code. The computer program code can include program logic, control logic, or other algorithms that may or may not be based on artificial intelligence (e.g., machine learning techniques, artificial neural network techniques, etc.).

Any of the modules or processors disclosed herein can be part of or in connection with a communications network. For example, the module or processor can include switches, transmitters, transceivers, routers, gateways, etc. to facilitate communications via a communication protocol that facilitates controlled and coordinated signal transmission and processing. The communication links can be established by communication protocols that allow the module or processor to form a communication interface. The communication interface can be configured to allow the module or processor and another device to form a communications network. For instance, the module or processor can be configured to communicate with a device (e.g., chip, expansion card, microcontroller, PID controller, another processor, another module, etc.) associated with a component of the communication system 300 and to facilitate data transmissions between the module or processor and at least one component of the communication system 300. The communications network can be configured as a long range wired or a wireless network, such as an Ethernet, telephone, Wi-Fi, Bluetooth, wireless protocol, cellular, satellite network, cloud computing network, etc. Embodiments of the communications network can be configured as a predetermined network topology. This can include a mesh network topology, a point-to-point network topology, a ring (or peer-to-peer) network topology, a star (point-to-multiple) network topology, or any combination thereof.

Embodiments of the analog signal processing module 100 can include a comparator circuit module 106. The comparator circuit module 106 can have a comparator circuit input 108 and a comparator circuit output 110. The comparator circuit module 106 can be configured to receive a first analog signal 112 at the comparator circuit input 108 and generate a digital output 114 at the comparator circuit output 110.

The comparator circuit output 110 can be connected to the processor 104. As noted above, the processor 104 is configured to select a digital sample from the digital output 114. For instance, the processor 104 can operate at a sampling rate within a range from 10 KHz to 10 MHz to generate the digital sample of the digital output 114.

Figure 2:
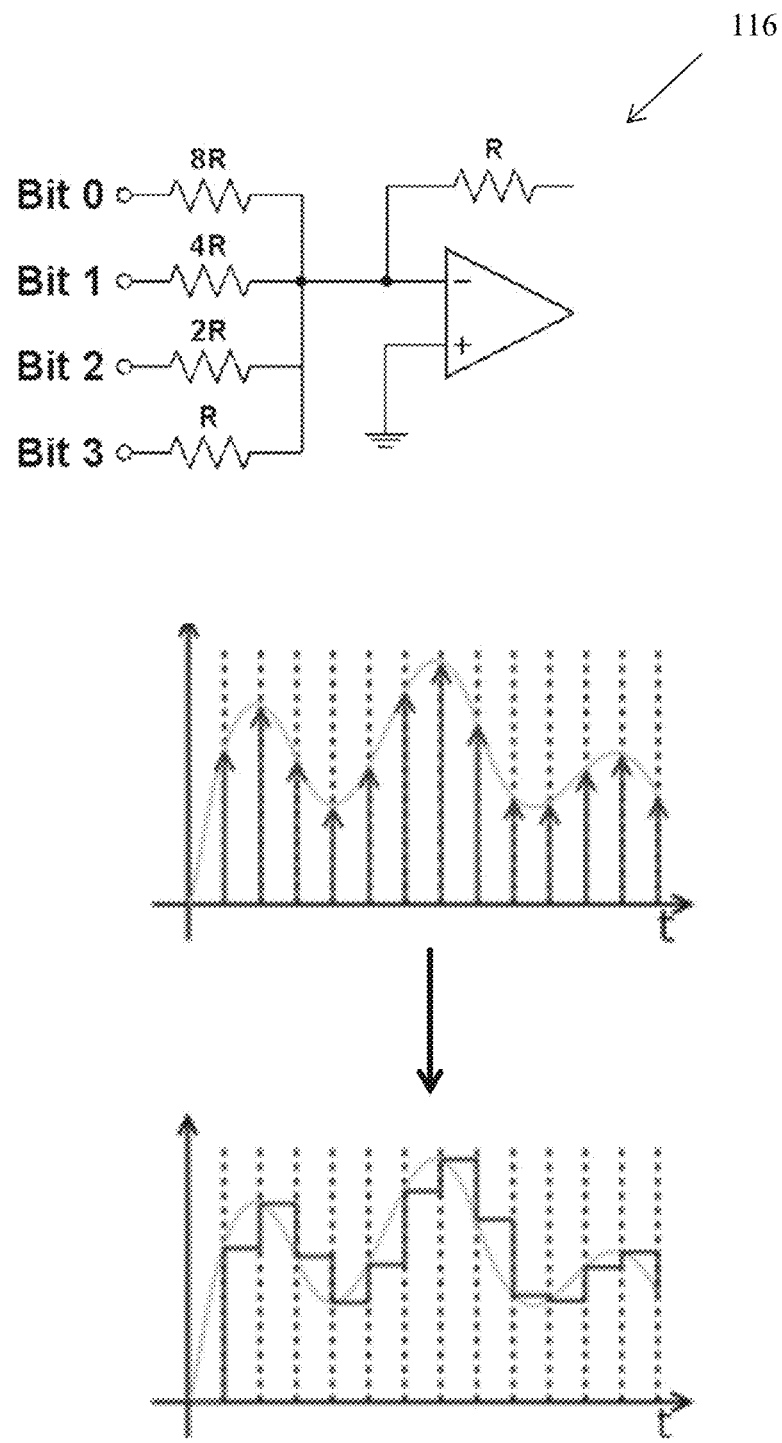
FIG. 2 shows an exemplary digital-to-analog converter (DAC) module architecture and exemplary resultant waveform constructions that can be generated using an embodiment of the DAC module.

Embodiments of the analog signal processing module 100 can include a digital-to-analog converter (DAC) module 116 configured to receive a digital output from the processor 104 and convert the digital output to a second analog signal 118. For instance, and with reference to FIG. 2, the DAC module 116 can convert the digital output to the second analog signal 118 by taking digital numbers that are representative of the second analog signal 118 and converting them into a sequence of impulses that are then processed by a reconstruction filter. The reconstruction filter can utilize an interpolation function to fill in data between the impulses. This can be done by converting the digital numbers into a piecewise constant function made up of a sequence of step functions. The DAC module 116 (via the Nyquist-Shannon sampling theorem, for example) can reconstruct the first analog signal 112 from the sampled digital data to generate the second analog signal 118.

The analog signal processing module 100 can also include an operational amplifier (OpAmp) circuit module 120 having an OpAmp circuit input 122 and an OpAmp circuit output 124. The OpAmp circuit module 120 can be configured to receive the second analog signal 118 at the OpAmp circuit input 122.

The analog signal processing module 100 can be configured to generate a feedback loop formed by the processor 104, the DAC module 116, and the OpAmp circuit module 120. In an exemplary embodiment, the feedback loop is configured to implement an amplification function or attenuation function to be performed by the OpAmp circuit module 120 on the second analog signal 118. The amplification function or attenuation function performed by the OpAmp circuit module 120 on the second analog signal 118 can be done to generate an amplitude controlled second analog signal 126.

An exemplary comparator circuit module 106 has a first resistor ($R_1$) and a second resistor ($R_2$). The comparator circuit input 108 has an inverting comparator input node ($V_{ref}$) and a non-inverting comparator input node ($V_{in}$). The comparator circuit output 110 has a comparator output node ($V_{o\text{-}comp}$). An exemplary OpAmp circuit module 120 has an OpAmp circuit input 122 with an inverting OpAmp input node ($V_{inverting}$) and a non-inverting OpAmp input node ($V_{non\text{-}inverting}$). The OpAmp circuit output 124 has an OpAmp output node ($V_{o\text{-}OpAmp}$). In the exemplary analog signal processing module 100 shown in FIG. 1: $V_{ref}$ is configured to be connected to ground via $R_1$; $V_{in}$ is configured to receive the first analog signal 112; $V_{o\text{-}comp}$ is configured to be connected to the processor 104; $V_{non\text{-}inverting}$ is configured to receive the second analog signal 118; $V_{inverting}$ is configured to be connected to $V_{o\text{-}OpAmp}$; $V_{o\text{-}OpAmp}$ is configured to be connected to the processor 104; and $V_{ref}$ is configured to be connected to $V_{o\text{-}OpAmp}$ via $R_2$.

In some embodiments, the comparator circuit module 106 can be configured to generate a V+ at $V_{in}$ based on the first analog signal 112, generate a V− at $V_{ref}$, and compare V+ to V− so that $V_{o\text{-}comp}$ is generated as a binary output. The binary output can be generated by following $V_{o\text{-}comp}$=1 if V+>V−; $V_{o\text{-}comp}$=0 if V+<V−, or by following some other mathematical step function. For instance, the mathematical function can be such that $V_{o\text{-}comp}$=HIGH if V+>V−; $V_{o\text{-}comp}$=LOW if V+<V−, where HIGH is a numerical value that is greater than LOW. The comparator circuit module 106 can be configured to compare analog changes to a direct current signal level (Vcc), in which case V+=V− defines a change in logic state of the digital output from the comparator circuit module 106. The state change depends on whether V+ is greater than or less than V−. For V+ initially being less than V−, transitioning through V+=V−, and ending at V+ being greater than V− is a comparator circuit module 106 low output state and a comm channel is not present. For, V+ initially being greater than V−, transitioning through V+=V−, and ending at V+ being less than V− is a comparator circuit module 106 high output state and a comm channel is present.

In some embodiments, the OpAmp circuit module 120 is configured to generate a V+ at $V_{non\text{-}inverting}$ based on the second analog signal 118, generate a V− at $V_{inverting}$, and apply a gain to the second analog signal 118 based on a differential value between V+ and V−. The gain can be an amplification function, an attenuation function, or a combination of the two.

The processor 104 can be configured to select or generate a digital sample from the digital output 114, which can be used to generate a control signal. The control signal, via the feedback loop, is used for determining when the OpAmp circuit module 120 will apply the gain to the second analog signal 118.

The gain limits or bounds the amplitude of the second analog signal 118 to a predetermined amplitude range. Thus, the analog signal processing module 100, with the feedback loop prescribed herein, can be used to provide dynamic amplitude gain control for the second analog signal 118. For instance, the amplification function or the attenuation function (which are dependent on the control signal) can be performed dynamically (via the feedback loop) on the second analog signal 118 to limit or bound the amplitude of the second analog signal 118 to a predetermined amplitude range, thereby generating the amplitude controlled second analog signal 126. In an exemplary implementation, the processor 104 samples the digital output 114 to generate a control signal that is used to inform the OpAmp circuit module 120 when to apply gain or attenuation. The gain or attenuation is implemented via the amplification function or the attenuation function, which can be a standard compression/expansion transfer function (e.g., taking a running average and applying the gain/attenuation based on the average), for example. Forcing the amplitude controlled second analog signal 126 to remain within a predetermined amplitude range makes it easier to perform signal processing operations with the amplitude controlled second analog signal 126 when further signal processing and analysis is performed.

It is contemplated for the processor 104 to be a Field Programmable Gate Array (FPGA), but other processors 104 can be used, such as a central processing unit, a microprocessor, an application-specific instruction set processor, etc. A FPGA is a reconfigurable (a programmable logic device) integrated circuit. The FPGA can be programmed to perform a function, and then be re-programmed to perform a different function (i.e., it is reconfigurable). The FPGA architecture can be structured such that its function is not defined until it is programmed, it can be structured to be volatile (e.g., lose its program logic after losing power), it can be structured to run software, etc.

Some embodiments of the analog signal processing module 100 include a control module 128. The control module 128 can be used to adjust the hysteresis of the comparator circuit module 106. This can be done to facilitate the comparator circuit module 106 serving as a filter. For example, the first analog signal 112 can be representative of optical radiation (e.g., an optical communication signal 130—the modulated signal used in the communication system 300) within a first range of frequencies. The optical radiation can, however, include additional radiation that is deemed to be noise. The comparator circuit module 106 can include a first resistor ($R_1$) and a second resistor ($R_2$). As noted herein, in an exemplary embodiment, the comparator circuit input 108 has an inverting comparator input node ($V_{ref}$) and a non-inverting comparator input node ($V_1$), and the comparator circuit output 110 has a comparator output node ($V_{o\text{-}comp}$). The control module 128 can be configured to adjust the resistance of $R_1$ and/or $R_2$ so as to tune the hysteresis of the comparator circuit module 106 (e.g., adjust the threshold at which the $V_{o\text{-}comp}$=HIGH or the $V_{o\text{-}comp}$=LOW is generated) so that the comparator circuit module 106 generates a digital output 114 that excludes a second range of signal amplitudes associated with optical radiation. The second range of signal amplitudes can be the range of signal amplitudes that cover the optical radiation that is the noise. Thus, control module-comparator architecture can be used to null out the undesired light (e.g., noise) via adjustment of $R_1$ and $R_2$.

For instance, the first range of signal amplitudes can include optical radiation that is an optical communication signal 130 and noise. The second range of signal amplitudes can consist of optical radiation that is noise. The noise can include naturally occurring light, the naturally occurring light being solar light from direct illumination and/or terrestrial reflectance (e.g., ambient starlight). In the alternative, or in addition, the noise can be manmade light from any source other than light from an optical emission device 310 or a data transmitter 132 of the optical communication signal 130. The manmade light may have a spectral content that overlaps with spectral content of the light of the optical communication signal 130.

As noted herein, the optical communication signal 130 can be a modulated signal (e.g., amplitude modulated, frequency modulated, phase modulated, pulse position modulated, On-Off Key modulated, frequency presence modulated, etc.). The specific modulation scheme that is contemplated for use with the system 300 will be discussed in detail later.

Figure 3:
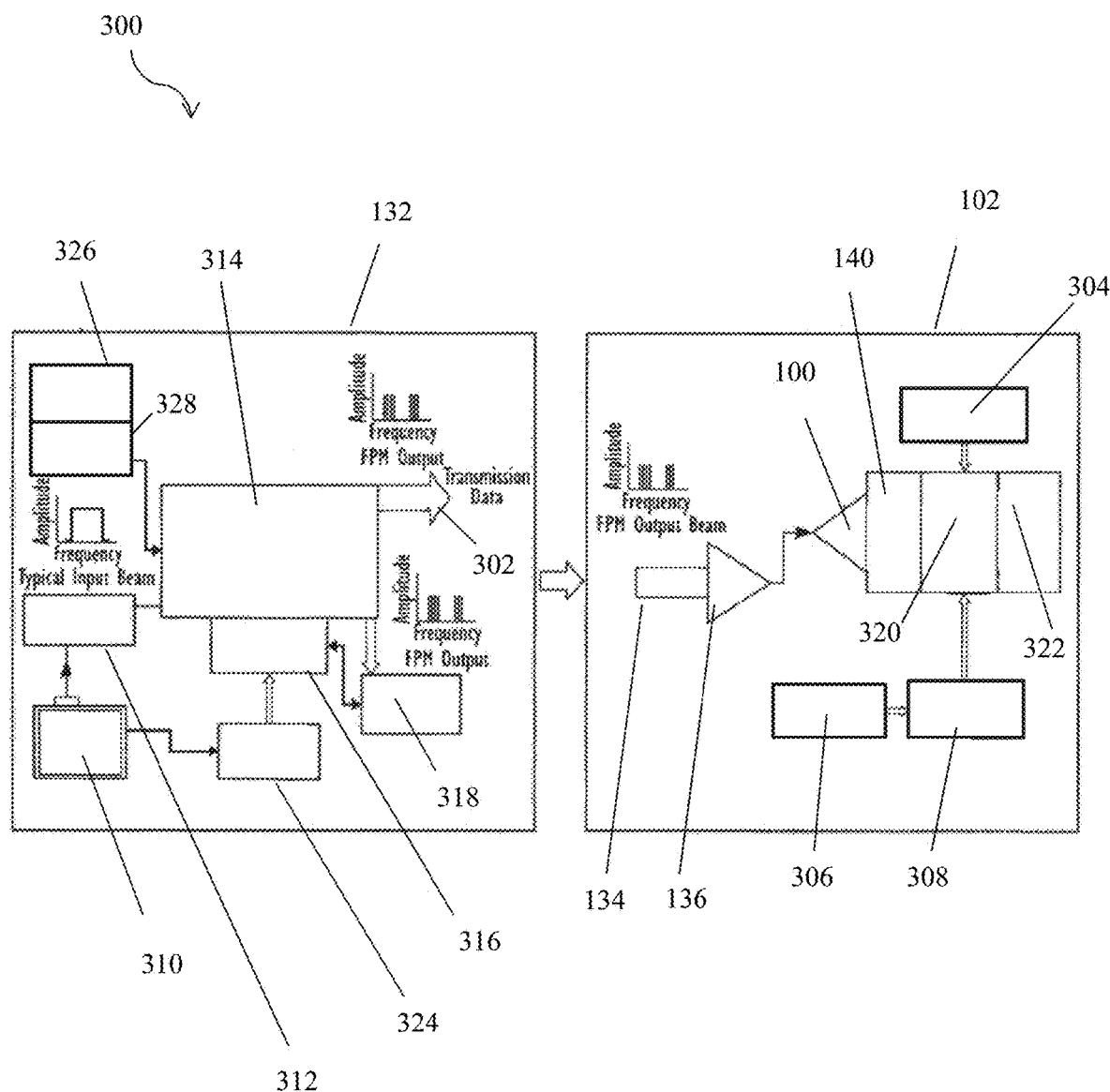
FIG. 3 shows a diagram for an exemplary optical communication system that can be used with an embodiment of the analog signal processing module.
Figure 4:
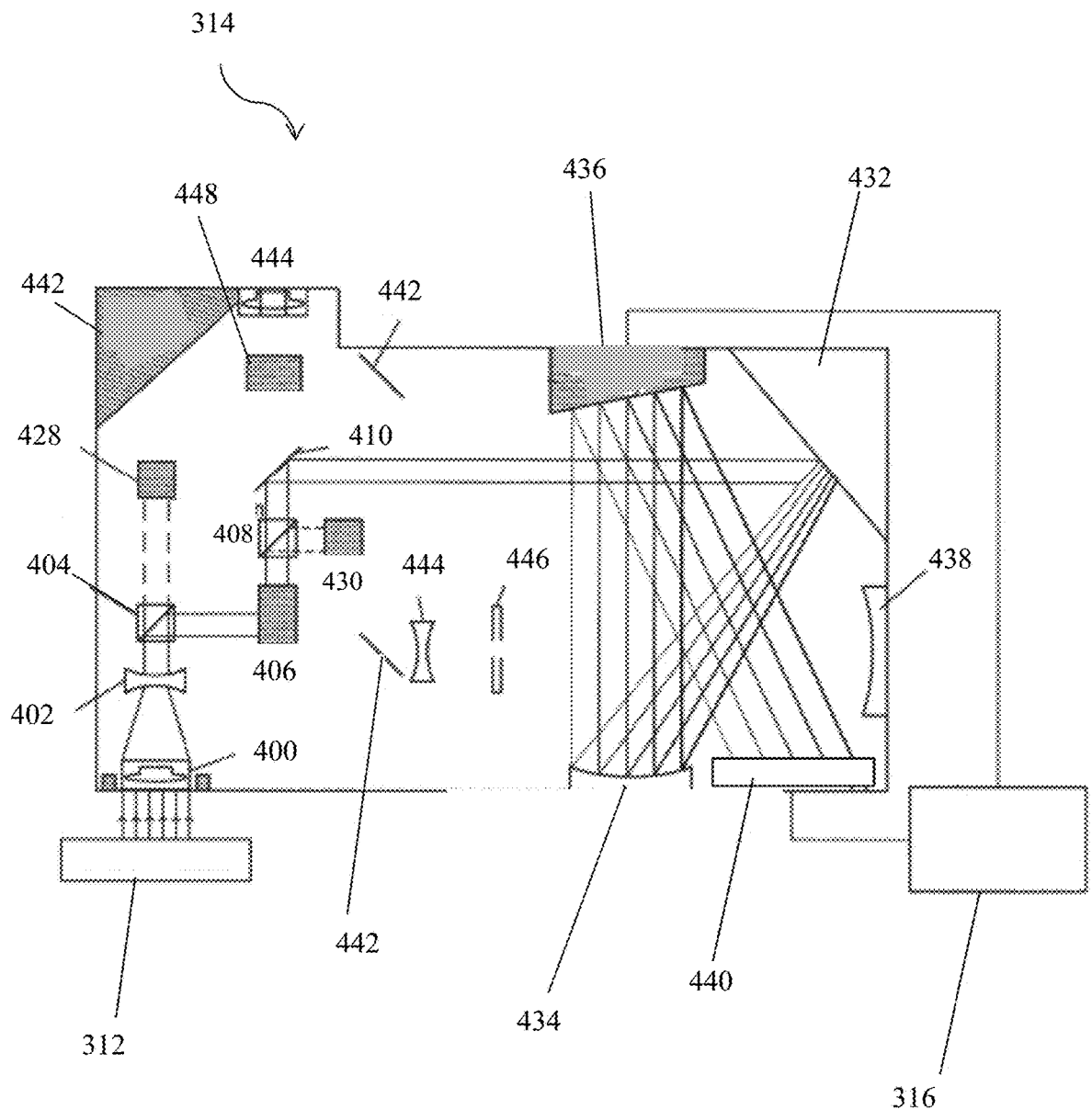
FIG. 4 shows an exemplary frequency presence modulation unit architecture that can be used with the exemplary optical communication system of FIG. 3.
Figure 5:
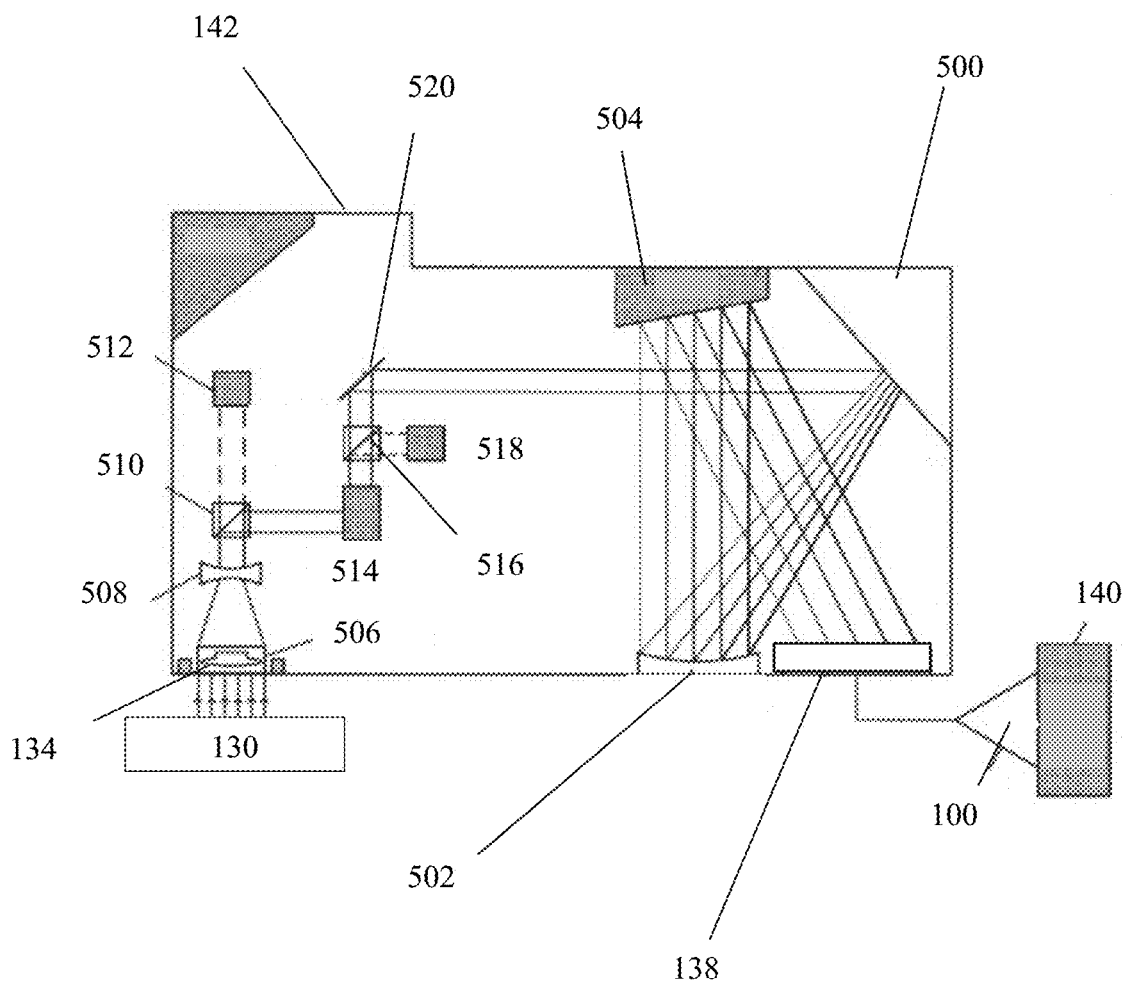
FIG. 5 shows an exemplary receiving module architecture that can be used with the embodiment of the data receiver of FIG. 1.

Referring to FIGS. 3-5, embodiments can include a data receiver 102 for an embodiment of the communication system 300. The data receiver 102 can include a receiving telescope 134 configured to receive the optical communication signal 130 and generate a beam output. In some embodiments, the data receiver 102 can include a receiver module (RM) 142 configured to receive the beam output from the receiving telescope 134.

An exemplary RM 142 has a RM grating 500 configured to disperse spectral content of the beam output. The RM 142 has a RM first mirror 502 configured to receive the dispersed spectral content of the beam output and collimate the dispersed spectral content of the beam output. The RM 142 has a RM second mirror 504 configured to receive the collimated spectral content of the beam output and direct the collimated spectral content of the beam output onto a photodiode array (PDA) 136 to generate the first analog signal 112.

Some embodiments of the data receiver 102 can include the receiving telescope 134 to receive the optical communication signal 130 transmitted by a transmitting telescope 302 of the data transmitter 132. In some embodiments, the PDA 136 can be configured to receive a beam output from the receiving telescope 134. The data receiver 102 can further include a first control optic 506, a second control optic 508, a first polarization cube 510, a first beam dump 512, a polarization periscope 514, a second polarization cube 516, a second beam dump 518, a directional mirror 520 and, a pin diode array 138. The directional mirror 520 can be a standard fixed mirror. This can be done to force all of the light of the spectral band to be reflected onto the pin diode array 138. With a frequency presence modulation technique used to generate frequency presence modulated light as the optical communication signal 130, forcing all of the light of the spectral band to be reflected onto the pin diode array 138 can facilitate determining which wavelengths are present. The analog signal processing module 100 then receives an electrical signal that is outputted from the PDA 136. After the analog signal processing module 100, the signal (e.g., the amplitude controlled second analog signal 126) enters a data input device 140. The output of the data input device 140 can be in the Ethernet format, for example. For example, a host processor 320 can receive the Ethernet signal (the host processor 320 can be connected to the data output device 322) and decode the received data corresponding to the modulated (e.g., via frequency presence modulation) output beam received by the receiving telescope 134. In some embodiments, the host processor 320 can be connected to a clock and timing device 304, a voltage management device 306, and a power management device 308.

As noted herein, the analog signal processing module 100 can be a component of the data receiver 102. Thus, the data receiver 102 can include an embodiment of the analog signal processing module 100, where the analog signal processing module 100 has an embodiment of the processor 104 and an embodiment of the comparator circuit module 106 having a comparator circuit input 108 and a comparator circuit output 110. The comparator circuit module 106 can be configured to receive the first analog signal 112 at the comparator circuit input 108 and generate a digital output 114. The comparator circuit output 110 can be connected to the processor 104. The analog signal processing module 100 can include an embodiment of the digital-to-analog converter (DAC) module 116 configured to receive the digital output 114 from the processor 104 and convert the digital output 114 to the second analog signal 118. The analog signal processing module 100 can include an embodiment of the operational amplifier (OpAmp) circuit module 120 having an OpAmp circuit input 122 and an OpAmp circuit output 124. The OpAmp circuit module 120 can be configured to receive the second analog signal 118 at the OpAmp circuit input 122. A feedback loop can be formed by the processor 104, the DAC module 116, and the OpAmp circuit module 120. The feedback loop can be configured to implement an amplification function or an attenuation function to be performed by the OpAmp circuit module 120 on the second analog signal 118. The amplification function or attenuation function performed by the OpAmp circuit module 120 on the second analog signal 118 can be done to generate an amplitude-controlled second analog signal 126.

For embodiments of the system 300 in which the optical communication signal 130 is frequency presence modulated, the RM 142 is configured as a frequency presence modulated receiving module (FPM-RM). It should be noted that other forms of modulation can be used, and thus the RM 142 can be configured as an amplitude modulated receiving module, a frequency modulated receiving module, a phase modulated receiving module, a pulse position modulated receiving module, an On-Off Keying modulated receiving module, etc. With the RM 142 being a FPM-RM, the optical communication system 300 can include an embodiment of the data receiver 102 in combination with a data transmitter 132 that is configured to generate a frequency presence modulated optical communication signal 130.

Embodiments of the optical communication system 300 can be used for terrestrial, airborne, and space optical communications, for example. Some embodiments of the optical communication system 300 can be used as a free space optical (FSO) communications network. The benefits of a FSO communications network span every telecommunications mission that intends to leave Earth's atmosphere. The use of free space optical networks has been envisioned as a desirable alternative to radio-based communications technology for a variety of reasons. Presently, free space optical networks do not compete for frequency space allocation. Optical communications are inherently more secure than radio-based communications, have the side benefit of ranging an order of magnitude better than presently employed radio frequency tracking techniques, and offer reduced size, weight, and power burden.

The optical communication system 300 can be configured to perform M-ary frequency presence modulation to capitalize on the available bandwidth of an optical emission device (i.e., laser, LED, etc.) to encode data for data transmission. M-ary transmission is a type of digital modulation where instead of transmitting one bit at a time, two or more bits are transmitted simultaneously. M-ary is a multilevel signaling communication technique, where M=number of discrete signal or voltage levels, N=number of bits, and M=2N. The M-ary communication technique can be used to design an optical communication system 300 that is bandwidth efficient. With such a system 300, the transmitter considers 'N' bits at a time, and it produces one of M signals, where M=2N. This type of transmission results in reduced channel bandwidth. A M-ary optical communication system 300 can achieve data transmission rates that are, for example, equal to or greater than 20 Gigabits per second (Gbps), and can transmit data over distances greater than 30 km (plus or minus ten percent) under nominal field conditions. Data can be transmitted over distances less than 30 Km. Data rates can be validated using the 100 Gigabit Ethernet (100 GbE) standard.

Frequency presence modulation of the operating bandwidth of an optical emission device 310 can be used for very high data rate, variable data rate, or moderate date rate optical communications. M-ary frequency presence modulation provides very high throughput with a single optical emission device 310, which results in more than a 50% reduction in size, weight, and power envelope compared to approaches using multiple optical emission devices. The M-ary frequency presence modulation schema uses a presence and absence of spectral content within the operating bandwidth of the optical emission device 310. For ultra-wide bandwidth emission sources (e.g., lasers, light emitting diodes, etc.), the spectral content of the optical emission device 310 may first be spectrally segregated into individual communication bands, followed by channelization of the spectral content within the band. Channel content can be electronically and optically directed to, or removed from, the transmission path. For narrow bandwidth optical emission devices 310, the functionality of the M-ary frequency presence modulation schema is unchanged from when an ultra-wide bandwidth optical emission device 310 is used, although the electronic and optical components may differ from those used for ultra-wide bandwidth transmission.

Frequency presence modulation can be performed in the data transmitter 132 of the optical communication system 300. An exemplary data transmitter 132 can include an optical emission device 310 configured to output light energy having an operating bandwidth in a nanometer range. This can be 1600 nm, for example. Examples of an optical emission device 310 for the system 300 can include an ultra-wide bandwidth (greater than 1,000 nm) laser, an ultra-wide bandwidth (greater than 300 nm) light emitting diode (LED), a narrow band (less than 5 nm) laser, a narrow band (less than 5 nm) LED, etc. For instance, the optical emission device 310 can be a commercially available deep red LED based transmitter with the appropriate H-alpha filters in order to only transmit within the H-alpha band. As another example, the optical emission device 310 can be a laser with approximately 1600 nm of bandwidth (e.g., anywhere between 1500 to 1800 nm) per pulse, which may be un-polarized (e.g., contains both vertical and horizontal polarized light). The laser pulse repetition rate can be, for example, 60 Mhz. However, any repetition rate can be used.

Embodiments of the data transmitter 132 can include a beam dividing device 312 configured to receive and divide the operating bandwidth of the light energy into bandwidth portions of plural communication bands. The beam dividing device 312 can be a spectral bandpass filter, a fiber optic grating (e.g., a Fiber Bragg Grating), etc. For instance, the ultra-wide bandwidth of the optical emission device 310 can be spectrally separated into bands of a user defined bandwidth via the beam dividing device 312. It is contemplated for each of the plural communication bands to have the same bandwidth. For example, if the optical emission device 310 is a laser with approximately 1600 nm of bandwidth, a 100 nm spectral bandpass filter can yield 16 independent bands (each having 100 nm bandwidth), a 50 nm spectral bandpass filter can yield 32 independent bands (each having 50 nm bandwidth), etc. It should be noted, however, that each of the plural communication bands do not have to have the same bandwidth.

The data transmitter 132 can include a frequency presence modulation (FPM) unit 314 configured to spectrally segregate a bandwidth portion of at least one communication band into plural channels, and modulate the bandwidth portion to selectively produce the optical communication signal 130 with wavelengths that correspond to one or more of the channels, wherein a presence and absence of energy within channels of the communication band constitute an information the packet for data communication. That is, the FPM unit 314 can be used to encode (channelize) data within the pulse emitted by the optical emission device 310. In an exemplary embodiment, a FPM unit 314 can be used for each band that has been spectrally separated within the bandwidth of the optical emission device 310. For example, if the optical emission device 310 is divided into sixteen 100 nm bands, sixteen FPM units 314 can be used to channelize each individual band separately. Each of the sixteen FPM units 314 can channelize bands having different frequencies.

The FPM unit 314 can be further configured to modulate the bandwidth to selectively produce the optical communication signal 130 with wavelengths that correspond to one or more of the channels, wherein the presence and absence of energy within channels of the communication band will constitute an information packet for data communication (e.g., the presence of energy within a channel represents a logic 1 value, and the absence of energy in a channel represents a logic 0 value).

The data transmitter 132 can also include a data controller 316 configured for providing a control signal to the FPM unit 314 to spectrally segregate the bandwidth portion of the at least one communication band into the plural channels. The data transmitter 132 can include the transmitting telescope 302 that transmits the optical communication signal 130 to the receiving telescope 134 (which can be part of an embodiment of the data receiver 102). With the optical communication signal 130 being frequency presence modulated, the spectral content of certain frequencies is present, and the spectral content of certain frequencies is not present.

It is contemplated for the optical communication signal 130 beam to be encrypted. Examples of cryptographic modules/encryption schemes that could be used include: NIST FIPS 140-2, AES 256, Ciena 6500 Flex3 WaveLogic 3e OCLD, Check Point CryptoCore, FIPS Crypto Module by Ionic Security Inc., Tanium Cryptographic Module, etc.

The data transmitter 132 can also include other components to assist in the effective and efficient operation thereof. These can include a clock and timing device 324, a voltage management device 326, a power management device 328, etc.

In some embodiments of the optical communication system 300, the FPM unit 314 can include plural optical adjustment components configured to adjust the orientation of the light energy being emitted from the beam dividing device 312. The FPM unit 314 can include a FPM grating 432 configured to receive the adjusted light energy from the plural optical adjustment components, disperse the spectral content of the adjusted light energy, and redirect the dispersed spectral content. FPM unit 314 can also include a FPM focusing mirror 434 configured to receive the dispersed spectral content from the FPM grating 432 and focus the dispersed spectral content. FPM unit 314 can also include a FPM digital mirror array 436 configured to receive the focused and dispersed spectral content from the FPM focusing mirror 434 and perform the spectral segregation of the bandwidth of the at least one communication band into the plural channels by adjusting at least one FPM digital mirror in the FPM digital mirror array 436. FPM unit 314 can also include a FPM focusing grating 438 configured to receive and focus a first set of wavelengths of the focused and dispersed spectral content reflected by the FPM digital mirror array 436.

In some embodiments, the first set of wavelengths can be outputted from the FPM unit 314 for inclusion in the optical communication signal 130. FPM unit 314 can include a FPM pin diode array 138 configured to receive a second set of wavelengths of the focused and dispersed spectral content reflected from the FPM digital mirror array 436 and convert the second set of wavelengths into electrical current to be sent to the data controller 316. The second set of wavelengths received by the FPM pin diode array 138 may not be transmitted by the transmitting telescope 302, but can rather be used for data verification 318.

In some embodiments, the plural optical adjustment components can include a control optic, a polarization cube, and a polarization periscope, and each control optic may have a corresponding beam dump device configured to absorb unwanted light. For instance, the plural optical adjustment components can include an arrangement of a control optics 400, 402, at least one polarization cube 404, 408, a polarization periscope 406, and a directional mirror 410, wherein the control optics 400, 402 have corresponding beam dump devices 428, 430 that absorb unwanted light.

In an exemplary embodiment, the control optic 400 receives as input the optical beam outputted from the optical emission device 310. The control optic 400 is an input optic for the spectral bandwidth of interest having very high transmission with the spectral bandpass, and very high attenuation of spectral content outside of the spectral bandpass. For example, if the optical emission device 310 is a vertical beam source with a bandwidth from 400 nm to 2100 nm (and if the FPM unit 314 is designed to channelize the band from 500 nm to 600 nm), the control optic 400 can allow light to pass through it in the 500 nm to 600 nm range, and not allow light outside of the 500 nm to 600 nm range into the FPM unit 314. The control optic 402 can be used to collimate the beam outputted from the control optic 400. The polarization cube 404 can be a high extinction coefficient (for example, >105) polarization cube oriented to reflect vertically polarized light. This can remove residual horizontal polarized light by transmitting the residual horizontal polarized light to the beam dump 428 (i.e., a photon graveyard) located in line with the polarization cube 404. The polarization periscope 406 is a sequence of mirrors (e.g., two mirrors) that changes the vertical height of the laser beam and also rotates the polarization from vertical to horizontal. The polarization cube 408 can be a high extinction coefficient (for example, >105) polarization cube oriented to reflect any residual vertically polarized light into the beam dump 430 and transmit the horizontal polarized light onto the directional mirror 410, which reflects the light onto the FPM grating 432.

The FPM grating 432 receives the adjusted beam from the plural beam adjustment components, disperses the spectral content of the adjusted beam, and redirects the dispersed spectral content. The FPM focusing mirror 434 receives the dispersed spectral content from the FPM grating 432 and focuses the dispersed spectral content. The FPM focusing mirror 434 is a reflective mirror that properly disperses (separates) the wavelengths (frequencies) of the spectral band across the FPM digital mirror array 436. The FPM focusing mirror 434 can be, for example, a metallic coated mirror, a dielectric coated mirror, etc. Metallic coated mirrors are generally polarization insensitive (i.e., reflectivity does not change) and dielectric coated mirrors are polarization sensitive (reflectivity does change). The type of mirror can be selected based on whether it will be used for vertical polarized light or horizontal polarized light.

The FPM digital mirror array 436 receives the focused and dispersed spectral content from the FPM focusing mirror 434 and performs the spectral segregation of the bandwidth of the at least one communication band into the plural channels by adjusting at least one digital mirror in the FPM digital mirror array 436. The mirrors in the FPM digital mirror array 436 can be controlled electronically (via the data controller 316, for example) so that their angle relative to the incident beam can be changed, which changes the propagation direction of the reflected beam. In an exemplary embodiment, the FPM digital mirror array 436 can be a 1,024×1,024 array of mirrors. However, it is possible that only a section of the array is controlled by the data controller 316. For example, a 3×1,024 section can be controlled so that the refresh rate is optimized.

The FPM unit 314 can also include a FPM pin diode array 440 that is used to convert light received onto the array into electrical current that is sent to the data controller 316 for verification of the data encoding. With a select code verification sequence, the digital mirrors in the FPM digital mirror array 436 can be in the "off" state (i.e., position/angle), and all of the light that is input into the FPM unit 314 ends up on the pin diode array 440. That is, light incident on the FPM grating 438 is spectrally dispersed onto the FPM digital mirror array 436, which reflects the light onto the pin diode array 440. The selected code verification sequence can detect abnormalities in the components of the FPM unit 314 because it is expected to receive the same frequencies on the pin diode array 440 as those inputted into the FPM unit 314. If this is not the case, the data controller 316 can make this determination by comparing the frequencies detected by the pin diode array 440 to the frequencies inputted into the FPM unit 314. The non-transmit mode is equivalent to a sequence of zeroes (off states) being transmitted and sequence of ones (on states) being verified.

The FPM unit 314 can also include other components to assist in the effective and efficient operation thereof. These can include additional mirrors 442, control optics 444, pin hole apertures 446, polarization periscope 448, etc. More detailed information about frequency presence modulation techniques and other code transmitting and verifying sequences of FPM units 314 can be appreciated from U.S. Patent Publication No. 2018/0191445, which is incorporated herein by reference in its entirety.

Some embodiments relate to a method for optical communication. The method can involve receiving a first analog signal 112 at a comparator circuit module 106 and generating a digital output 114. The method can involve selecting or sampling a digital sample from the digital output 114 via a processor 104. The method can involve receiving the sampled digital output 114 at a digital-to-analog converter (DAC) module 116 and generating a second analog signal 118. The method can involve receiving the second analog signal 118 at an operational amplifier (OpAmp) circuit module 120. The method can involve generating a feedback loop with the processor 104, the DAC module 116, and the OpAmp circuit module 120 so that an amplification function or attenuation function will be performed by the OpAmp circuit module 120 on the second analog signal 118 to generate an amplitude-controlled second analog signal 126.

The method can involve generating a control signal from the sampled digital output 114 that will be used to determine when the amplification function or attenuation function will be performed by the OpAmp circuit module 120.

In some embodiments, the amplification function or attenuation function can limit the amplitude of the second analog signal 118 to a predetermined amplitude range.

In some embodiments, the first analog signal 112 can be representative of optical radiation within a first range of signal amplitudes. The comparator circuit module 106 can be adjusted so that the digital output 114 will exclude a second range of signal amplitudes associated with the optical radiation. The first range of signal amplitudes may include optical radiation that is an optical communication signal 130 and noise. The second range of signal amplitudes can include optical radiation that is noise.

The method can involve generating light energy having an operating bandwidth. The method can involve dividing the operating wavelength of the light energy into bandwidth portions of plural communication bands. The method can involve spectrally segregating a bandwidth portion of at least one communication band into plural channels. The method can involve modulating the bandwidth portion to selectively produce an optical communication signal 130 with wavelengths that correspond to one or more of the channels, wherein a presence and absence of energy within channels of the communication band will constitute an information packet for data communication. The method can involve dispersing spectral content of the optical communications signal to generate the first analog signal 112.

It will be understood that modifications to the embodiments disclosed herein can be made to meet a particular set of design criteria. For instance, any of the modules, processors, circuitry, optics, or any other component can be any suitable number or type of each to meet a particular objective. Therefore, while certain exemplary embodiments of the system, components, and methods of making and using the same disclosed herein have been discussed and illustrated, it is to be distinctly understood that the invention is not limited thereto but can be otherwise variously embodied and practiced within the scope of the following claims.

It will be appreciated that some components, features, and/or configurations can be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein. Additionally, the disclosure of a range of values is a disclosure of every numerical value within that range, including the end points.

What is claimed is:

1. An analog signal processing module, comprising:
    a processor;
    a comparator circuit module having a comparator circuit input and a comparator circuit output, the comparator circuit module configured to receive a first analog signal at the comparator circuit input and generate a digital output, wherein the comparator circuit output is connected to the processor, wherein:
        the comparator circuit module includes a first resistor ($R_1$) and a second resistor ($R_2$);
        the comparator circuit input includes an inverting comparator input node ($V_{ref}$); and
        $R_1$ and $R_2$ are connected to $V_{ref}$;
        the comparator circuit input includes a non-inverting comparator input node ($V_{in}$);
    and the comparator circuit output includes a comparator output node ($V_{o\text{-}comp}$);
        the OpAmp circuit input includes an inverting OpAmp input node ($V_{inverting}$) and a non-inverting OpAmp input node ($V_{non\text{-}inverting}$); and the OpAmp circuit output includes an OpAmp output node ($V_{o\text{-}OpAmp}$);
        $V_{ref}$ is configured to be connected to ground via $R_1$; $V_{in}$ is configured to receive the first analog signal; and $V_{o\text{-}comp}$ is configured to be connected to the processor; and
        $V_{non\text{-}inverting}$ is configured to receive the second analog signal; $V_{inverting}$ is configured to be connected to $V_{o\text{-}OpAmp}$; $V_{o\text{-}OpAmp}$ is configured to be connected to the processor; and $V_{ref}$ is configured to be connected and to $V_{o\text{-}OpAmp}$ via $R_2$;
    a digital-to-analog converter (DAC) module configured to receive a digital output from the processor and convert the digital output to a second analog signal;
    an operational amplifier (OpAmp) circuit module having an OpAmp circuit input and an OpAmp circuit output, the OpAmp circuit module configured to receive the second analog signal at the OpAmp circuit input; and
    a feedback loop formed by the processor, the DAC module, and the OpAmp circuit module configured to implement an amplification function or attenuation function performed by the OpAmp circuit module on the second analog signal to generate an amplitude controlled second analog signal.

2. The analog signal processing module recited in claim 1, wherein:
    the comparator circuit module is configured to generate a V+ at $V_{in}$ based on the first analog signal, generate a V− at $V_{ref}$, and compare V+ to V− so that $V_{o\text{-}comp}$ is generated as a binary output, wherein $V_{o\text{-}comp}=1$ if V+>V−; $V_{o\text{-}comp}=0$ if V+<V−;
    the OpAmp circuit module is configured to generate a V+ at $V_{non\text{-}inverting}$ based on the second analog signal, generate at V− at $V_{inverting}$, and apply a gain to the second analog signal based on a differential value between V+ and V−, the gain being the amplification function or attenuation function; and
    the processor is configured to select a digital sample from the digital output to generate a control signal, the control signal being configured for determining when the OpAmp circuit module will apply the gain to the second analog signal.

3. The analog signal processing module recited in claim 2, wherein the gain limits the amplitude of the second analog signal to a predetermined amplitude range.

4. The analog signal processing module recited in claim 1, wherein the processor is a Field Programmable Gate Array.

5. An analog signal processing module comprising:
a processor;
a comparator circuit module having a comparator circuit input and a comparator circuit output, the comparator circuit module configured to receive a first analog signal at the comparator circuit input and generate a digital output, wherein the comparator circuit output is connected to the processor, wherein:
the comparator circuit module includes a first resistor ($R_1$) and a second resistor ($R_2$);
the comparator circuit input includes an inverting comparator input node ($V_{ref}$); and
$R_1$ and $R_2$ are connected to $V_{ref}$;
a digital-to-analog converter (DAC) module configured to receive a digital output from the processor and convert the digital output to a second analog signal;
an operational amplifier (OpAmp) circuit module having an OpAmp circuit input and an OpAmp circuit output, the OpAmp circuit module configured to receive the second analog signal at the OpAmp circuit input;
a feedback loop formed by the processor, the DAC module, and the OpAmp circuit module configured to implement an amplification function or attenuation function performed by the OpAmp circuit module on the second analog signal to generate an amplitude controlled second analog signal;
a control module;
the first analog signal is representative of optical radiation within a first range of amplitudes;
wherein the comparator circuit input includes a non-inverting comparator input node ($V_{in}$); and the comparator circuit output includes a comparator output node ($V_{o\text{-}comp}$); and
wherein the control module is configured to adjust the resistance of $R_1$ and/or $R_2$ to tune the hysteresis of the comparator circuit module so that the comparator circuit module generates a digital output that excludes a second range of amplitudes of the optical radiation.

6. The analog signal processing module recited in claim 5, wherein:
the first range of signal amplitudes that includes optical radiation that is an optical communication signal and noise; and
the second range of signal amplitudes that consists of optical radiation that is noise.

7. The analog signal processing module recited in claim 6, wherein the noise includes:
naturally occurring light, the naturally occurring light being solar light from direct illumination and/or terrestrial reflectance; and
manmade light, the manmade light being light from any source other than light from an optical communication signal source generating the optical communication signal, wherein the manmade light has spectral content that overlaps with spectral content of the light of the optical communication signal.

8. The analog signal processing module recited in claim 6, wherein the optical communication signal is frequency presence modulated.

9. A data receiver for a communication system, comprising:

a receiving telescope configured to receive a modulated optical communications signal and generate a modulated optical beam output;
a receiver module (RM) configured to receive the modulated beam output from the receiving telescope, wherein the RM includes:
a RM grating configured to disperse spectral content of the modulated beam output;
a RM first mirror configured to receive the dispersed spectral content of the modulated beam output and collimate the dispersed spectral content of the modulated beam output, and
a RM second mirror configured to receive the collimated spectral content of the modulated beam output and direct the collimated spectral content of the modulated beam output onto a photodiode array (PDA) to generate a first analog signal;
an analog signal processing module, analog signal processing module including:
a processor;
a comparator circuit module having a comparator circuit input and a comparator circuit output, the comparator circuit module configured to receive the first analog signal at the comparator circuit input and generate a digital output, wherein the comparator circuit output is connected to the processor;
a digital-to-analog converter (DAC) module configured to receive the digital output from the processor and convert the digital output to a second analog signal;
an operational amplifier (OpAmp) circuit module having an OpAmp circuit input and an OpAmp circuit output, the OpAmp circuit module configured to receive the second analog signal at the OpAmp circuit input; and
a feedback loop formed by the processor, the DAC module, and the OpAmp circuit module configured to implement an amplification function or attenuation function performed by the OpAmp circuit module on the second analog signal to generate an amplitude controlled second analog signal;
a data transmitter configured to generate the modulated optical communications signal, wherein the data transmitter includes:
an optical emission device configured to output light energy having an operating bandwidth;
a beam dividing device configured to receive and divide the operating bandwidth of the light energy into bandwidth portions of plural communication bands;
a frequency presence modulation (FPM) unit configured to spectrally segregate a bandwidth portion of at least one communication band into plural channels, and modulate the bandwidth portion to selectively produce the modulated optical communications signal with wavelengths that correspond to one or more of the channels, wherein a presence and absence of energy within channels of the communication band constitute an information the packet for data communication, the FPM unit including:
plural optical adjustment components configured to adjust the orientation of the light energy being emitted from the beam dividing device;
a FPM grating configured to receive the adjusted light energy from the plural optical adjustment components, disperse the spectral content of the adjusted light energy, and redirect the dispersed spectral content;

a FPM focusing mirror configured to receive the dispersed spectral content from the FPM grating and focus the dispersed spectral content;

a FPM digital mirror array configured to receive the focused and dispersed spectral content from the FPM focusing mirror and perform the spectral segregation of the bandwidth of the at least one communication band into the plural channels by adjusting at least one FPM digital mirror in the FPM digital mirror array;

a FPM focusing grating configured to receive and focus a first set of wavelengths of the focused and dispersed spectral content reflected by the FPM digital mirror array, wherein the first set of wavelengths are outputted from the FPM unit for inclusion in the modulated optical communications signal; and a FPM pin diode array configured to receive a second set of wavelengths of the focused and dispersed spectral content reflected from the FPM digital mirror array and convert the second set of wavelengths into electrical current that is sent to the controller, wherein the second set of wavelengths received by the FPM pin diode array are not transmitted by the transmitting telescope and are used for data verification;

a controller configured for providing a control signal to the FPM unit to spectrally segregate the bandwidth portion of the at least one communication band into the plural channels; and a transmitting telescope configured to transmit the optical communications signal.

10. The data receiver recited in claim 9, wherein the RM is configured as a frequency presence modulated receiving module (FPM-RM).

11. The optical communication system recited in claim 9, wherein the plural optical adjustment components include a control optic, a polarization cube, and a polarization periscope.

12. A method for optical communication, the method comprising:

receiving a first analog signal at a comparator circuit module and generating a digital output, the first analog signal being representative of optical radiation within a first range of amplitudes, wherein:

the comparator circuit module includes a first resistor ($R_1$) and a second resistor ($R_2$);

the comparator circuit input includes an inverting comparator input node ($V_{ref}$); and $R_1$ and $R_2$ are connected to $V_{ref}$; and the comparator circuit input includes a non-inverting comparator input node ($V_{in}$), and the comparator circuit output includes a comparator output node ($V_{o\text{-}comp}$);

selecting a digital sample from the digital output via a processor;

receiving the sampled digital output at a digital-to-analog converter (DAC) module and generating a second analog signal;

receiving the second analog signal at an operational amplifier (OpAmp) circuit module, wherein the processor, the DAC module, and the OpAmp circuit module form a feedback loop so that an amplification function or attenuation function will be performed by the OpAmp circuit module on the second analog signal to generate an amplitude controlled second analog signal; and adjusting the resistance of $R_1$ and/or $R_2$, via a control module, to tune the hysteresis of the comparator circuit module so that the comparator circuit module generates a digital output that excludes a second range of amplitudes of the optical radiation.

13. The method recited in claim 12, comprising:
generating a control signal from the sampled digital output that will be used to determine when the amplification function or attenuation function will be performed by the OpAmp circuit module.

14. The method recited in claim 13, wherein the amplification function or attenuation function limits the amplitude of the second analog signal to a predetermined amplitude range.

15. The method recited in claim 13, wherein:
the first analog signal is representative of optical radiation within a first range of signal amplitudes;
the comparator circuit module is adjusted so that the digital output will exclude a second range of signal amplitudes of the optical radiation;
the first range of signal amplitudes includes optical radiation that is an optical communication signal and noise; and
the second range of signal amplitudes includes optical radiation that is noise.

16. The method recited in claim 12, comprising:
generating light energy having an operating bandwidth;
dividing the operating wavelength of the light energy into bandwidth portions of plural communication bands;
spectrally segregating a bandwidth portion of at least one communication band into plural channels;
modulating the bandwidth portion to selectively produce an optical communications signal with wavelengths that correspond to one or more of the channels, wherein a presence and absence of energy within channels of the communication band will constitute an information packet for data communication; and
dispersing spectral content of the optical communications signal to generate the first analog signal.

* * * * *